United States Patent [19]

Carrison

[11] Patent Number: 4,486,893
[45] Date of Patent: Dec. 4, 1984

[54] CAPACITIVE SUPPLEMENT MULTIPLIER APPARATUS

[75] Inventor: Craig L. Carrison, Golden Valley, Minn.

[73] Assignee: Honeywell Inc., Minneapolis, Minn.

[21] Appl. No.: 589,979

[22] Filed: Mar. 15, 1984

Related U.S. Application Data

[63] Continuation of Ser. No. 263,533, May 14, 1981, abandoned.

[51] Int. Cl.³ .................... G11C 19/28; H01L 29/78
[52] U.S. Cl. ...................................... 377/60; 357/24; 377/62
[58] Field of Search ....................... 357/24; 377/57-63

[56] References Cited

U.S. PATENT DOCUMENTS

| | | |
|---|---|---|
| 3,806,772 | 4/1974 | Early ........................................ 357/24 |
| 3,947,705 | 3/1976 | Emmons . |
| 3,986,198 | 10/1976 | Kosonocky ........................... 357/24 |
| 4,034,199 | 7/1977 | Lampe et al. . |
| 4,071,775 | 1/1978 | Hewes ................................... 357/24 |
| 4,071,906 | 1/1978 | Buss . |
| 4,084,256 | 4/1978 | Engeler . |
| 4,120,035 | 10/1978 | Cases et al. . |
| 4,156,284 | 5/1979 | Engeler . |
| 4,161,785 | 7/1979 | Gasparek . |
| 4,309,624 | 1/1982 | Hynecek et al. .................. 357/24 M |
| 4,323,791 | 4/1982 | Berger et al. ........................... 357/24 |

Primary Examiner—Gene M. Munson
Attorney, Agent, or Firm—Theodore F. Neils

[57] ABSTRACT

A monolithic integrated circuit is provided capable of providing charge packets which are selectable multiples of other charge packets. This capability is provided by a charge-coupled device floating gate regenerator and an associated MOS capacitive region.

15 Claims, 4 Drawing Figures

CAPACITIVE SUPPLEMENT MULTIPLIER APPARATUS

This application is a continuation of application Ser. No. 263,533, filed May 14, 1981, now abandoned.

BACKGROUND OF THE INVENTION

The present invention relates to multiplication by a constant of the charge quantity in a distinct charge aggregation, i.e. a charge packet, occurring in charge-coupled devices, and more particularly, to a charge-coupled device technology floating gate regenerator capable of providing a charge packet having a charge quantity equal to that in another charge packet multiplied by a constant.

For signal processing purposes, the capability to perform arithmetical operations on distinct charge aggregations, i.e. charge packets, in charge-coupled device signal processors is required. Addition of the charge quantities in two such charge packets can be quite simple, just the routing of the two charge packets to being below a common charge-coupled device gate where the charges are combined to form a charge quantity equal to the sum of the charges in the two original charge packets. Subtraction can be performed rather straightforwardly using a floating gate regenerator.

However, attempts to provide multiplication and division capabilities in charge-coupled device technology signal processing systems have led to more cumbersome procedures and structures. Nevertheless, multiplication by a constant, at least, is strongly desired to permit a satisfactory implementation of many signal processing algorithms.

SUMMARY OF THE INVENTION

Invention provides a monolithic integrated circuit capable of providing distinct charge aggregations which contain charges equal to selectable multiples of that charge contained in another distinct charge aggregation. This capability is provided by a charge-coupled device floating gate regenerator interconnected with a multiplier means gate and an associated semiconductor region. The multiplying constant can be selected through controlling the voltage applied to the multiplier means.

DESCRIPTION OF THE PREFERRED EMBODIMENT

Figure 1:
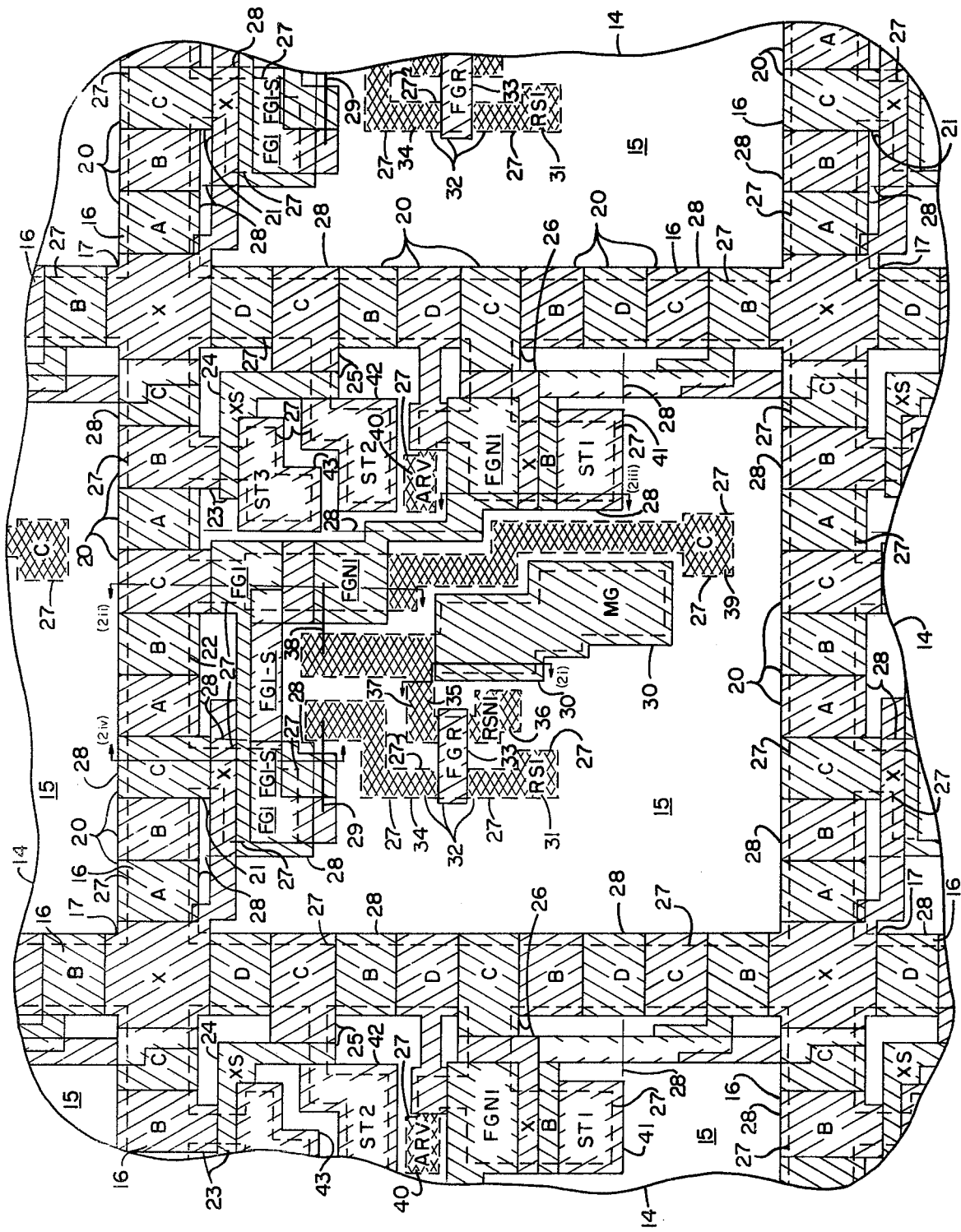
FIG. 1 is a representational layout of a monolithic integrated circuit chip portion embodying an aspect of the present invention.

FIG. 1 shows a broken out portion of a monolithic integrated circuit chip, 14, which includes a complete signal processing cell, 15, and a surrounding portion of an intercellular communication mesh, 16. The charge-coupled device links of intercellular communication mesh 16 meet at intersections, 17, which are also formed as charge-coupled device gates, and which serve to transfer a charge packet coming under such an intersection gate from an adjacent charge-coupled device link in mesh 16 to any of the charge-coupled device links in mesh 16 adjacent to that intersection 17. Portions of other signal processing cells 15, neighboring that particular signal processing cell 15 presented in its entirety in FIG. 1, can also be seen in that figure.

Each structural component link of mesh 16 between intersections 17 is a charge-coupled device operating on three clocking, or control, signal phases supplied to doped, polycrystalline silicon gates, 20. These doped, polycrystalline silicon, i.e., polysilicon, gates are applied in two separate polysilicon depositions such that gates formed from the second deposition slightly overlap the edges of gates formed from the first polysilicon deposition though, even in so overlapping, they are separated from one another by an insulating layer which is conveniently silicon dioxide. Thus, gates 20 should be represened in FIG. 1 in such a manner that there would be a dashed line, representing the edges of first deposition polysilicon gates just inside the edges of these gates. Such detail, however, has been omitted in FIG. 1 to avoid drawing complexity that is unnecessary for understanding, these omissions being inside for purposes of clarity as have some other feature details.

Other measures have been taken in FIG. 1 to ease understanding. In particular, none of the metallization interconnection system portions have been shown, again for clarity because they would obscure that which lay below without much benefit to the ensuing explanation. That is, a number of the regions in FIG. 1 are electrically interconnected using metallic interconnection runs provided from a metallization deposition. Moreover, polysilicon, in both the first and second depositions thereof, is also used for certain electrical interconnections which in many instances have not been shown in FIG. 1 to improve clarity by avoiding complexity it is of no particular aid to the description following. Furthermore, for consistency, all of the lines shown in FIG. 1 should be dashed in view of there being a protective insulating layer thereover, but this would make drawing understanding much more difficult and so has not been done. These omitted features are well known to those skilled in the art and can be provided by such persons without substantial difficulty. So, in the interest of providing a view of a portion of chip 14 which can be more easily understood, these omissions and other slight abstractions have been used.

To differentiate among gates 20 in FIG. 1, and among other polysilicon gates therein, crosshatching in the form of a series of same direction diagonals, having the lower portion thereof on the left and rising to the higher portion thereof on the right, is used to denote polysilicon gates obtained from the first polysilicon deposition. The gates obtained from the second polysilicon deposition are shown by a series of opposite, but common, direction diagonals: higher portions thereof on the left and lower portions thereof on the right. Thus, for example, intersections 17 are all obtained from the second polysilicon deposition while all of the gates immediately adjacent to each of intersections 17 are obtained from the first polysilicon deposition. In those situations in FIG. 1 where a structure obtained from the second polysilicon deposition is provided over a structure obtained from the first polysilicon deposition, just the beginnings of diagonals running in each direction are shown along the second polysilicon deposition structure to indicate that it is over a first polysilicon deposition structure.

The charge-coupled device links of mesh 16 between intersections 17 are, as above indicated, three phase charge-coupled devices. Designations of the clocking signals, or control signals, which are supplied to each polysilicon gate in FIG. 1 and similarly to other polysilicon gates in chip 14 except gates intended to "float" at indirectly set potentials in some periods during operation have been marked thereon in FIG. 1 in capital letters. The clocking signals for gates 20 can be seen to be provided thereto in a repetitive three signal sequence corresponding to three phase operation. Horizontal portions of mesh 16 are operated by the clocking signals A, B and C, while the vertical portions of mesh 16 are operated by the clocking signals B, C and D.

Assume that a charge packet is stored under any one of the gates 20 in mesh 16 by there being a positive voltage applied thereto and a much smaller positive voltage or no voltage being applied to the gates on either side thereof. Assume that there is a desire to shift this charge packet held under the gate having the relatively large positive voltage thereon to an immediately adjacent gate in the charge-coupled device on one side or the other of the gate presently storing the charge packet. The adjacent gate under which the charge packet is desired to be shifted is provided with a large positive voltage and, very shortly thereafter, the gate originally storing the charge packet has the large positive voltage thereon substantially reduced or made equal to zero. The gates having the third clocking signal applied thereto are kept a low or zero voltage during this sequence. As a result, the charge packet will shift under the gate now having the large positive voltage provided thereon and remain there until further directions to mesh 16 are provided in the form of changes in the clocking or control signals provided thereto.

This method in general of transferring charge packets is suitable even when one of the gates is either the initially storing gate or the adjacent gate intended to receive such a charge packet, and is also a gate at an intersection 17 where the clocking or control signal provided thereto is indicated in FIG. 1 to be denoted by X. Again, this method of transferring charge packets is also suitable for transferring charge packets into and out of signal processing cells 15 at one of the five entrance-exit ports provided in each: (i) port 21 located in the upper left-hand portion in each signal processing cell 15 comprising (a) that one of the gates 20 having clock signal C applied thereto adjacent to an extension of the gate at an intersection 17 having clock signal X applied thereto, and (b) this gate extension: (ii) port 22 located in the upper middle portion of each signal processing cell 15 comprising (a) that one of gates 20 having clock signal C applied thereto adjacent to a floating gate designated FGI, and (b) floating gate FGI; (iii) port 23 located in the upper right-hand portion of each signal processing cell 15 comprising (a) that one of gates 20 having clock signal B applied thereto adjacent to a storage transfer gate, 24, having a clock signal XS applied thereto, and (b) storage transfer gate 24; (iv) port 25 also located in the upper right-hand portion of each signal processing cell 15 comprising (a) that one of gates 20 having a clock signal C applied thereto adjacent to storage transfer gate 24, and (b) storage transfer gate 24; and (v) port 26 located in the middle right-hand portion of each signal processing cell 15 comprising (a) that one of gates 20 having clock signal C applied thereto adjacent another extension of the gate at another intersection 17, and (b) this gate extension.

A further measure undertaken to confine charge packets to being (i) under those of gates 20 intended, as indicated by the application thereto of relatively large positive voltages, or (ii) under other intended polysilicon gates within signal processing cells 15 with such intention again being communicated through use of control signals of relatively large positive voltage values being applied to such gates, is the provision of "channel stops" in chip 14. The edges or boundaries of such "channel stop" regions are indicated in FIG. 1 by the numerical designation 27. Channel stop boundaries 27 are shown there in short dashed lines but, in some places, these are difficult to follow because solid lines indicating other structural features occur immediately thereover.

The channel stop line 27, located primarily along the periphery of signal processing cells 15 with dips into cells 15 at ports 21, 22, 23, 25 and 26, forms a closed major loop with the interior of this loop enclosing, except in selected portions around which other channel stop lines 27 occur, a structure of relatively thick silicon dioxide over p+-type conductivity silicon portions which in turn are over other portions of the p-type conductivity silicon substrate of chip 14. The just mentioned exception portions within the major loop are bounded by closed minor loops of lines 27 outside of which occurs the thick oxide structure just set out. Outside the major loop formed by channel stop lines 27, primarily along the periphery of signal processing cells 15 in mesh 16 and in the dips into signal processing cells 15 at the ports thereof with the exception of the dip at port 22, the structure is that of relatively thin silicon dioxide over n-type conductivity silicon portions which in turn are over other portions of the p-type conductivity silicon substrate. At port 22 the structure outside line 27 is that of thin silicon dioxide over the p-type conductivity silicon substrate.

The potential energy of electrons at p+-type conductivity silicon portions under thick oxide is relatively high so as to make the attractiveness to electrons relatively low to thereby serve to confine the electrons in a charge packet to regions of the n-type or p-type semiconductor material silicon under the thin oxide region. The thin oxide regions are, of course, just those about which the polysilicon gates in FIG. 1 are provided. Thus, the (i) thick oxide regions, and (ii) the positive voltages on selected polysilicon gates over the thin oxide regions, are together such to keep the charge packets confined to being under those selected gates.

Further, as the above structural description indicates, the charge-coupled device links in intercellular communication mesh 16 and intersections 17 together form buried channel charge-coupled devices. The polysilicon gates and the structure therebelow of each signal processing cell 15 in chip 14 in FIG. 3, except the gates and structure associated with port 22, also operate as buried channel charge-coupled devices. The polysilicon gates and the structure therebelow in chip 14 at port 22 in FIG. 1 operate as a surface channel charge-coupled device with a transition through port 22 to the buried channel charge-coupled device adjacent in mesh 16. Buried channels for the buried channel charge-coupled devices are formed under the thin oxide portions along the channels provided by the channel stop boundaries through doping the material immediately under the thin oxide to be of n-type conductivity as indicated above.

For the surface channel charge-coupled devices, the thin oxide in the channels formed by the channel stops is directly over the p-type conductivity silicon substrate.

A long dashed line, 28, forms a single closed loop in FIG. 1 at each cell 15 within which there no impurity doping occurs for converting the silicon substrate to n-type conductivity buried channel regions, but outside of which such impurity doping is undertaken everywhere to form buried channel regions beneath the thin oxide. Dashed line 28 is nearly completely covered by the edges of polysilicon gates in each signal processing cell 15 and in mesh 16 in FIG. 3 making it very difficult to determine the location of the regions which are subjected to the ion implantation doping used to form the buried channel regions. The actual buried channels, of course, are confined because of the fabrication process sequence to being beneath the thin oxide regions in the channels formed by the channel stop edges through which the implantation can reach the silicon semiconductor material below. The implantation cannot penetrate the thick oxide portions of the channel stop structure, and so do not change the silicon material portions below them from the p+-type conductivity type provided during the fabrication of the channel stop structures.

The primary gates for the charge-coupled device technology arrangements internal to each signal processing cell 15 are the two gates in the floating gate regenerator and the multiplier gate associated therewith. The floating gates of the floating gate regenerator in cells 15 in FIG. 1 are designated FGI for the inverting floating gate and FGNI for the non-inverting floating gate. Both of these gates are obtained from the first polysilicon deposition.

A further gate, a separating gate, is designated FGI-S and separate gates FGI and FGNI so that both of these gates will be overlapped by the separating gate. This assures that charge transfers can be made easily and smoothly between the inverting and non-inverting floating gates. However, separating gate FGI-S is electrically connected to inverting floating gate FGI so that both inverting floating gate FGI and the separating gate FGI-S are at the same electrical potential. Since any representation of the physical structures of metallization interconnections have been omitted from FIG. 1 for clarity, the electrical interconnection between inverting floating gate FGI and the separating gate FGI-S is shown by a solid line, 29, which occurs below port 21 in FIG. 1.

The interfaces between inverting floating gate FGI separating gate FGI-S, and non-inverting floating gate FGNI occur below port 22 in FIG. 1. The designations FGI, FGI-S and FGNI are set out in FIG. 1 with an underline beneath each of them to indicate that these are gate designations and not clocking or control signal designations.

A multiplier gate, 30, is also obtained from the first polysilicon deposition and is shown with the control signal MG marked thereon in FIG. 1. By adjusting the voltage level of signal MG, each signal cell 15 is capable of multiplying the charge quantity in a charge packet in the floating gate regenerator by a selected constant depending on the voltage level of signal MG as will be explained below.

Near these gate structures just mentioned within each signal processing cell 15 in FIG. 1 are a number of diffusions made through openings mentioned above in the channel stop structures indicated by channel stop structure edges 27 forming minor loops which are located entirely within each signal processing cell 15. These diffusions are shown in full crosshatching, i.e., shown with diagonals running in both directions. The first of these diffusions, 31, receives clocking signal RSI and serves as the drain of a first n-channel, metal-oxide-semiconductor field-effect transistor, 32, the remainder of which transistor is formed by a doped polysilicon gate, 33, obtained from the second polysilicon deposition and by a further diffusion, 34, serving as the source of transistor 32. The end of diffusion 34 away from gate 33 in transistor 32 is connected by metallization interconnection representational line 29 to inverting floating gate FGI and to separating gate FGI-S. Again, line 29 represents what would otherwise be a metal interconnection which, as above indicated, has not been shown for purposes of clarity.

Gate 33 of transistor 32 is provided with clocking or control signal FGR. Thus, signal RSI can be supplied to inverting floating gate FGI and separating gate FGI-S under the control of signal FGR. That is, signal FGR can switch transistor 32 from the "off condition" to the "on condition" to thereby supply clock signal RSI to inverting floating gate FGI and separating gate FGI-S. Switching back to the off condition removes signal RSI from these gates.

Silicon gate 33 also serves as a gate for a second n-channel, enhancement mode metal-oxide-semiconductor field-effect transistor, 35, comprising a drain diffusion, 36, to which is supplied clock signal RSNI, and a source diffusion, 37, as well as gate 33. The end of diffusion 37 away from gate 33 is electrically connected to non-inverting floating gate FGNI by metal interconnection represented in FIG. 1 by only a solid line, 38, again for purposes of clarity. Thus, clock signal FGR through controlling transistor 35 controls also the application of signal RSNI to non-inverting floating gate FGNI. Note also diffusion 37 is immediately adjacent to multiplier gate 30 and, as explained below, couples the effects of multiplier gate 30 to non-inverting floating gate FGNI for purposes of performing the multiplying-by-a-constant process to be explained below.

A further diffusion, 39, is provided immediately adjacent to non-inverting floating gate FGNI as a source of charge for this gate. The other end of diffusion 39 is brought out past multiplier gate 30 for the purposes of being connected into the metallization interconnection network to receive clocking, or control, signal C.

The other end of non-inverting gate FGNI is provided near a final diffusion, 40, which serves as a charge sink for emptying charge out from this end of non-inverting gate FGNI when permitted to do so by that one of gates 20 receiving clocking signal D and which has an extension thereof over the channel stop region between non-inverting floating gate FGNI and diffusion 40. Diffusion 40 is supplied with a constant voltage signal designated ARV as an accumulator reset voltage for purposes of attracting charge from non-inverting floating gate FGNI.

There are three storage sites based on charge-coupled device technology shown provided in each signal processing cell 15 in FIG. 1, and each of these storage sites has a polysilicon gate obtained from the second polysilicon deposition. The first of these storage sites has a gate 41 and can receive charge packets through port 26, through another arm of the extension of the gate at the corresponding one of intersections 17, and then through an extension of that one of gates 20 receiving clocking signal B which is immediately above the just mentioned intersection 17 gate in FIG. 1. Gate 41 receives clocking or control signal ST1 and, by the proper sequencing of signals on the gates involved in port 26 and on the extension of that gate just mentioned as receiving clocking signal B, a charge packet will be transferred from mesh 16 to being under this first storage gate 41. A reverse sequence of some of such signals permits a charge packet stored under gate 41 to be returned to mesh 16, or to be provided to non-inverting floating gate FGNI by shifting underneath the extension of the gate just mentioned as receiving clocking signal B and then underneath the extension from corresponding intersection gate 17.

The second storage site has a gate, 42, and, with suitable signals, charge packets can be received from, or returned to, mesh 16 through port 25. Gate 42 receives clocking signal ST2 and this signal, in proper sequencing with signal XS on transfer control gate 24 and with signal C on that corresponding one of gates 20, permits such receptions and returns of charge packets to be accomplished between mesh 16 and the storage site associated with gate 42.

Similarly, the third storage site has a gate, 43 and again, with suitable signals, charge packets can be received from, or returned to, mesh 16 through port 23. Gate 43 receives clocking signal ST3 which, in conjunction with signal XS on transfer control gate 24 and with signal B on that corresponding one of gates 20, permits receptions and returns of charge packets to be accomplished between mesh 16 and the storage site associated with gate 43.

Figure 2:
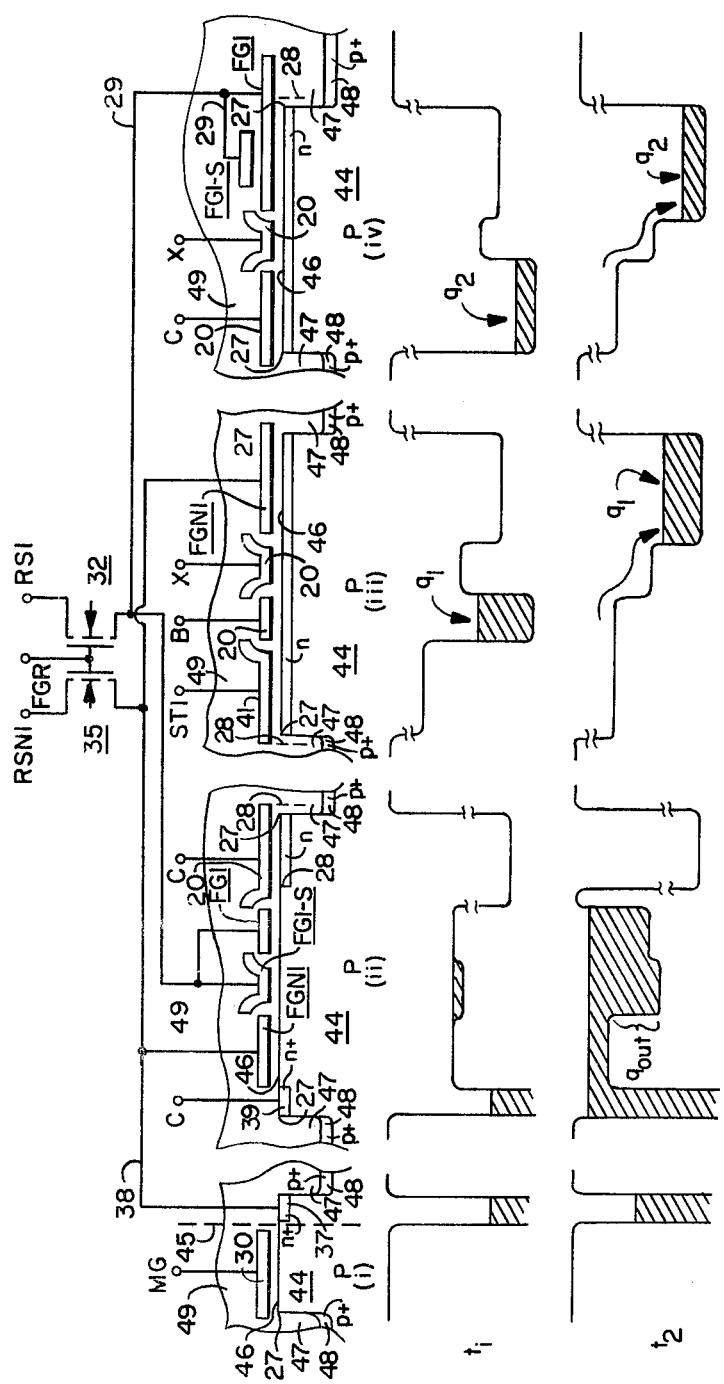
FIG. 2 is a cross section of portions of the monolithic integrated circuit chip portion of FIG. 1 and an illustration of an operational sequence associated with those cross sections.
Figure 2:
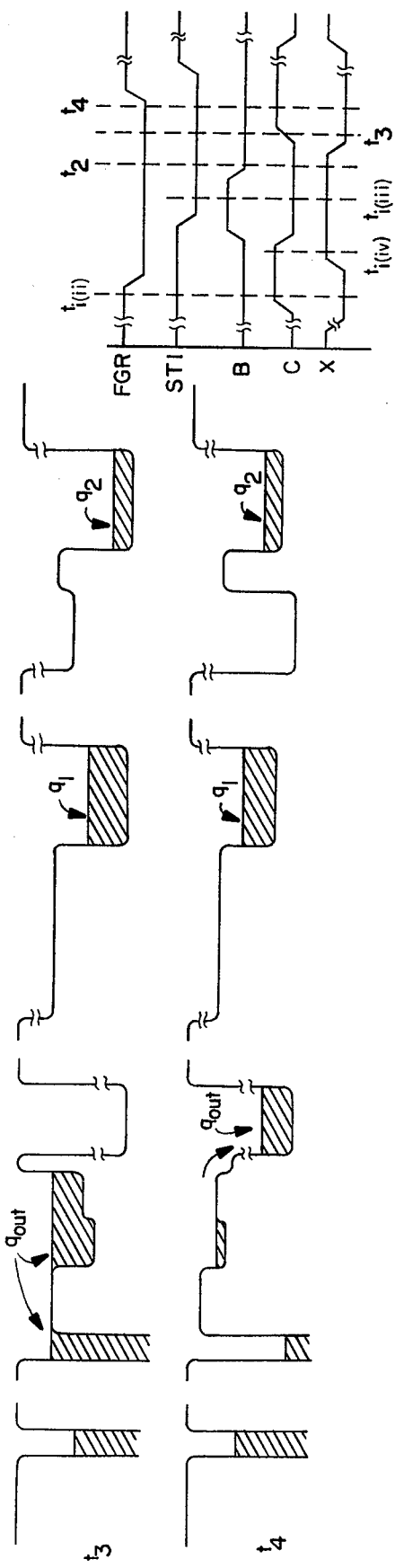

The understanding of the construction of each signal processing cell 15, and the operation thereof, is enhanced by cross section views of the major operating portions thereof so that the structural arrangements can be seen and so that the sequence of clocking or control signals and the corresponding charge packet transfers can be related thereto. FIG. 2 shows cross sectional views or elevations of four portions of the structure shown in layout or plan view in FIG. 1. The first of these cross sectional views is shown in FIG. 2 to the upper left, and is a broken cross section view taken through multiplier gate 30 and diffusion 37, the latter serving both as part of the interconnection between transistor 35 and non-inverting floating gate "FGNI and as the coupling of multiplier gate 30 to gate FGNI. This cross section view is designated (i) in FIG. 2, and the corresponding broken cross section line is designated (2i) in FIG. 1.

The second of these cross sectional views is shown in FIG. 2 to the right of the view designated (i) there and is designated (ii) in turn in FIG. 2. The corresponding cross section line is designated (2ii) in FIG. 1. This cross sectional view is taken through diffusion 39, a portion of non-inverting floating gate FGNI, a portion of separating gate FGI-S, a portion of inverting floating gate FGI and that one of gates 20 involved port 22 which is shown, in FIG. 1, to receive clocking signal C.

Moving further to the right in FIG. 2, the next cross sectional view there is designated (iii). The corresponding cross section line in FIG. 1 is designated (2iii) and is taken through first storage site gate 41, the extension of that one of gates 20 having clocking signal B provided thereto and which is adjacent to gate 41, the extension of the adjacent gate in intersections 17 to that gate 20 and to a portion of non-inverting floating gate FGNI, and finally through that same portion of non-inverting floating gate FGNI.

The concluding cross sectional view is the one farthest to the right in FIG. 2 and is designated (iv). The corresponding section line is designated (2iv) in FIG. 1 and is taken through both inverting floating gate FGI and separating gate FGI-S where separating gate FGI-S is structurally above inverting floating gate FGI at the point they are electrically connected to one another by a metallization interconnection as represented by line 29, with neither this representation nor the actual metallization being shown in FIG. 2. The cross section is further taken through the extension of an intersection 17 gate which is adjacent to inverting floating gate FGI at port 21 and through that one of gates 20 at port 21 receiving clocking signal C.

In FIG. 2, displayed below the cross sectional views (i), (ii), (iii) and (iv) are potential energy diagrams taken at certain points in time during an operating sequence which will be described below. Each cross sectional view has a vertical series below it of such potential energy diagrams showing the potential energy at various points in the monolithic integrated circuit chip semiconductor material below the polysilicon gates and at various succeeding times in the operational sequence. The clocking or control signals, provided as voltage waveforms which are supplied to the polysilicon gates in the cross sectional views, are shown below these potential energy diagrams and these voltage waveforms have the same time axis horizontally that the potential energy diagrams have vertically. The higher parts of these voltage waveforms represent more positive voltages than lower parts of the waveforms in the clocking signal diagram in FIG. 2.

As already suggested, the cross sectional views of FIG. 2 omit the metallization interconnection structure for purposes of clarity as was done in FIG. 1. However, the overlapping of the polysilicon gates obtained from the first and second polysilicon depositions is shown in the cross section views of FIG. 1. As previously noted, cross sectional view (i) is a cross section taken through multiplier gate 30 and diffusion 37 and the silicon semiconductor material substrate, 44. Since this cross section view is provided with a broken section line (2i) in FIG. 1, this section break has been shown in view (i) by a dashed line, 45. The p-type conductivity, silicon semiconductor material in substrate 44 is doped with boron to have a resistivity of around 10Ω-cm. Diffusion 37 is provided by doping the substrate in that region with phosphorus in a concentration $10^{18}$ atoms/cm$^3$ or more. Gate 30 is of arsenic doped polysilicon separated from a major surface, 46, of substrate 44 by silicon dioxide having a thickness of approximately 1000 Å. Channel stops are provided by relatively thick silicon dioxide portions, 47, which are over p$^+$-type conductivity regions, 48, formed in substrate 44 by doping these regions with boron to a concentration of $10^{18}$ atoms/cm$^3$ or more. Finally, there is shown a protective 3% phosphosilicate glass layer, 49, provided over multiplier gate 30 and over thick oxide regions 47, there being shown no boundaries between layer 49 and thick regions 47, although the composition in these regions do differ from one another.

Cross section view (ii) shows, as noted above, a cross section of diffusion 39 and of portions of the arsenic doped polysilicon floating gates of the floating gate regenerator at port 22 along with the arsenic doped polysilicon gate 20 at port 22 having clocking signal C applied thereto. Inverting floating gate FGI and non-inverting gate FGNI are easily seen to be obtained from the first polysilicon deposition and again are separated from major surface 46 by approximately 1000 Å of silicon dioxide. The same separation from surface 46 by silicon dioxide occurs in this view with respect to separating gate FGI-S and that gate 20 having clocking signal C. Under this latter gate, is shown a portion of the buried channel extending under mesh 16 bounded in this view by line 28 at major surface 46, and a corresponding thick oxide portion 47 marking the edge of the channel stop structure along this portion of mesh 16. The concentration of phosphorus in diffusion 39 is the same as in diffusion 37, but the concentration of phosphorus in the buried channel region under gate 20 is on the order of only about $10^{16}$ atoms/cm$^3$. The maximum depth of the pn semiconductor junction separating diffusion 37 and 39 from the remaining portions of substrate 44 is about 1.6 μm while the maximum depth of the pn semiconductor junction separating the buried channel region from the remaining portions of substrate 44 is approximately 1.0 μm.

Cross section view (iii), as previously stated, shows a cross section of non-inverting floating gate FGNI and an extension of corresponding gate 20 having clocking signal B applied thereto where both of these gates are obtained from the first doped arsenic polysilicon deposition. Also shown in cross section is gate 41 and an extension of a corresponding gate at an intersection 17 having clocking signal X applied thereto, where both of these gates are obtained from the arsenic doped second polysilicon deposition. All of these gates are separated from major surface 46 by approximately 1000 Å of silicon dioxide, and have below them, in the semiconductor material of substrate 44, a buried channel region.

Cross section view (iv), as stated above, shows a cross section of inverting floating gate FGI and a corresponding gate 20 having clocking signal C applied thereto, where both are obtained from the arsenic doped first polysilicon deposition. Also shown is another extension of a corresponding intersection 17 gate having clocking signal X applied thereto and separating gate FGI-S which were provided in the arsenic doped second polysilicon deposition. Separating gate FGI-S is very clearly shown to be obtained from the arsenic doped second polysilicon deposition as, in this view, it is fully over inverting gate FGI. All of these gates, except obviously separating gate FGI-S at this location, are separated from major surface 46 by approximately 1000 Å silicon dioxide and are each over a buried channel region.

The two metallization interconnection portions represented as single lines in FIG. 1 have the interconnections they represent shown in FIG. 2 as interconnection lines which are to imply conductive interconnections. The first of these conductors is line 29 and it appears in cross section view (iv) where it is shown interconnecting inverting floating gate FGI, separating gate FGI-S and transistor 32. The other conductor is line 38 and is shown extending between cross section views (i) and (ii) to interconnect diffusion 37 with non-inverting floating gate FGNI.

Further shown in FIG. 2 are transistors 32 and 35 from FIG. 1. Here they are represented by circuit symbology, rather than being shown in a cross section view from FIG. 2, to aid in understanding the operation of signal processing cells 15 and because they are formed of well-known, standard device structures used for providing n-channel, enhancement mode metal-oxide-semiconductor field-effect transistors. The connections to each of the polysilicon gates and to the transistors are shown with further lines representing conductive interconnections in FIG. 2, but these lines do not represent metallization interconnection system conductors. Instead, they represent in some instances, other portions of the polysilicon gates to which the transistors are connected, and they represent in other instances interconnecting diffusion runs in substrate 44.

The structures shown in FIGS. 1 and 2 are fabricated by generally well-known techniques. Such a fabrication begins upon a p-type conductivity wafer serving as substrate 44 which, as previously indicated, is doped with boron to have a resistivity of 10Ω-cm. A thin layer of silicon dioxide is grown thereon and silicon nitride is deposited thereover. The portions desired have a thick oxide provided thereover for channel stop purposes, i.e. the field regions, are determined and photoresist with such a pattern is then provided on the silicon nitride. This provision is followed by etching away the unwanted silicon nitride portions over the desired channel stop regions, that is, the field regions. The silicon nitride is then used as a mask for etching away the now exposed underlying silicon dioxide portions to expose substrate 44 at locations where field regions are desired. A boron implant is made to provide the p+-type conductivity regions for the channel stops. The field oxide for the channel stop regions is then grown.

Then the remaining portions of the silicon nitride and the remaining underlying silicon dioxide regions are removed from over the remaining regions, i.e. the feature regions, and a new thin layer of silicon dioxide is grown over substrate 44 where exposed in at feature regions. A further boron ion implantation step is made through this thin oxide to adjust the threshold voltage for inverting the substrate material by a voltage on a gate separated from the substrate material by an insulator layer.

Thereafter, photoresist is placed over everything except the portions of the feature regions where buried channels are desired to occur and a phosphorus ion implantation step is performed to provide the buried channel regions. The photoresist and the feature region silicon dioxide layer are then stripped away and an annealing step is performed to repair the lattice of the silicon semiconductor material at the locations of the foregoing implantations.

A new thin layer of silicon dioxide is grown and the first deposition of arsenic doped polysilicon is performed. Photoresist is used to define the portions of the feature regions which are to obtain polysilicon gates from the first deposition and an etching step then removes the unwanted portions of the first polysilicon deposition followed by removal of the photoresist. The now exposed silicon dioxide in the feature regions not covered by the remaining portions of the first polysilicon deposition are stripped away and a new thin layer of silicon dioxide is then grown over the exposed semiconductor material of substrate 44 and over the remaining portions of the first polysilicon deposition. Thereafter, a second deposition of arsenic doped polysilicon is provided. Again, photoresist is used to define the portions of the second polysilicon deposition which are to be used as polysilicon gates. The unwanted portions of the second polysilicon deposition are then etched away and the photoresist is thereafter stripped away. Also stripped away then is any of the thin layer of silicon dioxide which has not been covered by the second polysilicon deposition.

A phosphorus ion implantation step is then made which leads to phosphorus reaching the surface of the silicon semiconductor material in any places where the last thin layer of silicon dioxide has been stripped away. Thereafter, a 3% phosphosilicate glass deposit is made over the wafer followed by a thermal annealing cycle to repair lattice damage and to drive into substrate 44 the last implanted phosphorus to form sources and drains for the transistors and other desired diffusions. Thereafter, the usual etching steps, metal deposition steps and patterning of such metal steps are made to provide the metallization interconnection network. Finally, a passivation layer is applied followed by providing openings therein to expose metallization pads for electrical interconnections to other electrical components.

The portions of chip 14 in FIG. 1 in which the cross sectional views are taken, as shown in FIG. 2, comprise the essentials of the floating gate regenerator used in each signal processing cell 15 of chip 14 which perform all the arithmetical and logic operations in signal processing cells 15. The basic mode of operation for formation of an output charge packet with some selected relation to certain input charge packets is shown in FIG. 2 by both the clocking or control signal voltage waveforms over time and the potential energy diagrams set out there.

The proper initial conditions in which the various portions of the floating gate regenerator are placed to develop an output charge packet with some selected relationship to certain input charge packets are shown in the voltage waveforms over time and the potential diagrams over space and time of FIG. 2 at various times $t_i$. As the voltage waveform diagram shows, the various portions of the floating gate regenerator are placed in the proper initial conditions at different times so that there is a different time $t_i$ for each of the cross section views in FIG. 2 in the first horizontal set of potential energy diagrams in the row labelled with time $t_i$—the conditions shown in the $t_i$ row actually come into being at different times during the operation.

Cross sectional view (i) shows the situation when there is multiplications of the input charge packets by a standard value constant (here 0.5) which always occurs in the operation of the floating gate regenerator, this standard value being appropriate for showing the basic operation of this generator. Where the standard multiplication is desired, clock signal MG is at a calibrated, relatively low, positive voltage with the result that the potential energy over surface 46 of substrate 44 under gate 30 is at higher levels. Nothing further will be stated here about the multiplication operation during the immediately following basic regenerator operation description. The multiplication operation will be described subsequently.

Clock signal RSNI at the drain of transistor 35 and clock signal RSI at the drain of transistor 32 can be assumed to be at 15 volts during the entire sequence of operational steps set out in FIG. 2. As a result, at time $t_{i(ii)}$, with clock signal FGR at the gates of transistors 32 and 35 being also at 15 volts as is indicated in the voltage waveforms in FIG. 4, clocking signal RSNI is applied directly to diffusion 37 in cross section view (i) making it a reduced value source of charge, the charge being indicated by the single direction cross hatching of the potential diagram portion corresponding to diffusion 37 thereabove for time $t_i$.

In cross section view (ii) of FIG. 2, clocking signal FGR, being at 15 volts, leads not only to clocking signal RSNI being applied to diffusion 37 as indicated and to commonly connected floating gate FGNI but also to clocking signal RSI being applied to both floating gate FGI and separating gate FGI-S. The result is shown in the potential energy diagram therebelow of the surface potential at surface 46 of substrate 44 for time $t_{i(ii)}$ where the potential energy is indicated to be relatively low. The surface potential shown below separating gate FGI-S is slightly lower than that shown below floating gates FGNI and FGI. This is because the doping level of substrate 44 is slightly lowered below the separating gate due to the etching away of the thin layer of silicon dioxide prior to the second polysilicon deposition and concomitant slight reduction of the doping concentration at surface 46, this etching being required prior to providing the second polysilicon deposition from which separating gate FGI-S is obtained.

At time $t_{i(ii)}$, clocking signal C is also at 15 volts so that the potential energy diagram for view (ii) below the portion of gate 20 having clocking signal C is approximately equal to that below the floating gates for the small portion of this gate 20 which does not have a buried layer below it, but then is shown considerably lower beneath that portion of this gate 20 having the buried layer region underneath it. Note that the potential energy shown in the diagrams of FIG. 4 is that occurring at surface 46 in those instances where there is no buried layer, but that the potential energy shown in these diagrams where there is a buried layer region is that occurring near the pn semiconductor at the junction between the buried layer regions and remaining portions of substrate 44. The potential energy in these buried layer regions is so much lower that breaks are indicated by slash lines in the potential energy curve as it approaches or leaves potential energy curve portions for these buried layer regions.

This application of voltage waveforms to the otherwise "floating" gates FGI, FGI-S and FGNI removes any residual charge from underneath these gates. This prepares these gates for generating, at that location, an output charge packet at the end of the operation cycle following, i.e. resets the floating gate generator for a new operation.

In cross section view (iii) of FIG. 2, at time $t_{i(iii)}$, clock signal ST1 on gate 41 for storage site 1 has gone to zero in voltage value while gate 20 having clocking signal B thereon has 15 volts applied to it. The first input charge packet, designated $q_1$ and shown by single direction cross hatching, has been assumed to have been stored at the storage site beneath gate 41 prior to beginning the coming operational sequence of the floating gate regenerator. As a result of the voltage waveforms at time $t_{i(iii)}$, charge packet $q_1$ has been transferred from the storage site beneath gate 41 to being beneath gate 20 as shown there by the cross hatching. Charge packet $q_1$ does not go beyond gate 20 at this time because of the 7.5 volt potential applied to the extension of the gate at corresponding intersection 17 having clock signal X applied thereto.

The potential energy near the buried channel region junction beneath floating gate FGNI established thereby transistor 35 and clock signals RSNI and FGR is maintained at this later time $t_{i(iii)}$ because of the various capacitances effectively connected to this node. This potential energy is of a lower value in cross section view (iii) than in cross section view (ii) because of the buried layer being underneath the portion of floating gate FGNI in cross section view (iii) but not in view (ii). The slash lines in the potential energy diagram in cross section view (iii) again indicate there is a substantial offset in the potential energy diagram here due to the buried channel region.

In cross section view (iv) of FIG. 2 at time $t_{i(iv)}$, the second input charge packet is assumed to have been brought along mesh 16 to gate 20 having clock signal C thereon. Thus, the second charge input packet, $q_2$ is shown by cross hatching below this gate 20. The charge packet is kept there by there being a channel stop on the left side and by having clock signal X being at 7.5 volts on the extension of the gate at the corresponding intersection 17. Again the potential energy beneath the buried channel region beneath floating gate FGI established earlier by transistor 32 and clock signals RSI and FGR is maintained at this time by $t_{i(iv)}$ by the effective capacitance connected to this node. Also again, there are slash line breaks on either side of the potential energy diagram in cross section view (iv) at time $t_{i(iv)}$ to indicate there is a substantial offset in the potential energy due to the buried layer region there.

The initial conditions depicted for cell 15 structures at times $t_{i(ii)}$, $t_{i(iii)}$, and $t_{i(iv)}$ are essentially maintained until clocking signals C and B decrease from 15 volts to zero volts which can be seen as occurring by time $t_2$ in the voltage waveforms of FIG. 2. With this change in clocking signal C, which is followed by the change in clocking signal B, the input charge packet $q_2$ and then the input charge packet $q_1$ are transferred to being beneath floating gate FGI and floating gate FGNI, respectively. This is shown as having been accomplished by time $t_2$ in the horizontal set of potential energy diagrams for time $t_2$ shown in FIG. 2. At time $t_2$, clock signal FGR has returned to zero volts so that both transistors 32 and 35 are switched into the off condition preventing clock signals RSI and RSNI from further affecting the floating gate regenerator until such time as clocking signal FGR returns to 15 volts.

The transfer of the input charge packet $q_1$ and $q_2$ to being under floating gates FGNI and FGI, respectively, causes the voltages previously maintained on these gates by the associated charged capacitances to decrease and, since charge packets $q_1$ and $q_2$ in general differ in the charge quantities contained in each, the voltage changes by a differing amount on floating gate FGNI as compared to the voltage change on floating gate FGI. This change in voltage leads to a change in the potential energy below the floating gates and to a different potential energy below each. This can be seen in cross section view (ii) for time $t_2$ where the potential energy beneath floating gate FGNI is greater than it is beneath floating gate FGI as well as beneath separating gate FGI-S. The decrease in voltage on floating gate FGNI also makes charge available at a higher potential energy at the pn semiconductor junction of diffusion 37 and substrate 44 in cross section view (i) but this has no operational significance.

The decrease in voltage from 15 to zero volts in clocking signal C by time $t_2$ also makes charge abundantly available at a much greater potential energy diffusion 39 of cross section view (ii). As a result, charge flows beneath floating gates FGNI and FGI and beneath separating gate FGI-S. However, with clocking signal C being at zero volts, a relatively high potential energy occurs beneath gate 20 having clocking signal C applied thereto in view (ii) at that portion thereof which does not have a buried channel region below it. Thus, there is a sufficient potential barrier to prevent the charge flowing from the junction of diffusion 39 beneath the floating gates to being transferred beneath gate 20 in view (ii).

The subsequent decrease in voltage in clocking signal B from 15 volts to zero volts raises the potential energy below gate 20 in view (iii) with the result being shown there of input charge packet $q_1$ being transferred over the potential barrier provided by clocking signal X to being beneath floating gate FGNI by time $t_2$. Similarly, the decrease in voltage in clocking signal C on gate 20 in view (iv) from 15 to zero volt leads, as earlier indicated, to input charge packet $q_2$ being transferred over the potential barrier provided by clocking signal X to being beneath floating gate FGI by $t_2$.

At time $t_3$, clocking signal C has begun to rise from zero volts back toward 15 volts. This has no affect in the multiplier structure shown in view (i). However, in the view (ii), charge at the junction of diffusion 39 is made available at lower and lower potential energy until the potential energy at the junction equals that beneath floating gate FGNI. At this point, any charge beneath gate FGNI has spilled back to diffusion 39 and there is an amount of charge trapped beneath floating gate FGI and separating gate FGI-S by the potential barrier on either side thereof. These potential barriers are due to the potential energy below floating gate FGNI because of charge packet $q_1$ and below gate 20 because of clocking signal C applied thereto in view (ii).

Even though clock signal C is increasing, it is not increasing so fast that it does not maintain a potential barrier beneath gate 20 in this view until the charge beneath floating gate FGI and separating gate FGI-S is trapped. As indicated in the potential energy diagram for view (ii) at time $t_2$ the difference in voltage on floating gate FGNI, on the one hand, and floating gate FGI and separating gate FGI-S, on the other, leads to the difference in potential energy below these gates and provides the basis for charge being trapped beneath floating gate FGI and separating gate FGI-S. The potential energy diagram beneath view (ii) for time $t_3$ indicates this trapped charge becomes the output charge packet, $q_{out}$, of the floating gate regenerator in this operation.

Notice that the trapped charge is proportional to the difference in potential energy beneath floating gate FGNI and the potential energy beneath floating gate FGI and separating gate FGI-S. This potential energy difference is directly due to the difference in charge quantities in the input charge packets $q_1$ and $q_2$ as indicated above. Furthermore, because of connection 38 between diffusion 37 and floating gate FGNI, multiplier gate 30 affects in a manner to be described below the voltage level of floating gate FGNI and, hence, the potential energy below this floating gate to effect multiplication by a constant. The result is that the floating gate regenerator output charge packet, $q_{out}$, has the following dependence:

$$q_{out} = F(V_{MG})q_1 - kq_2 \qquad q_1 > q_2$$
$$q_{out} = 0 \qquad q_1 < q_2$$

Symbols $q_{out}$, $q_1$ and $q_2$ have been explained in the foregoing and are shown explicitly in FIG. 2. $V_{MG}$ is the voltage in signal MG and the symbology $F(V_{MG})$ represents the effect of the multiplier gate in providing $q_{out}$.

The symbol k is a constant depending on the capacitance of the floating gate FGI. The foregoing equations represent the floating gate regenerator operation and from this expression the arithmetical and logic capabilities of the generator can be derived.

Finally, at time $t_4$, clocking signal C has risen to a full 15 volts reducing the potential energy barrier below logic gate 20 in view (ii). As a result, output charge packet $q_{out}$ is transferred beneath logic gate 20 and ready to be transferred along mesh 16 to a desired destination therefor. Note that neither of the input charge packets $q_1$ and $q_2$ have been altered nor lost in this process and, therefore, are still available.

The multiplier structure of view (i) in FIG. 2 operates by changing the capacitance value associated with floating gate FGNI to thereby change the voltage on this gate otherwise due to an input charge packet $q_1$. As a result, the potential energy under floating gate FGNI in view (ii) changes to thereby change the quantity of charge provided in the output charge packet $q_{out}$ at the end of the operational sequence described above in connection with FIG. 2.

This changing of the capacitance associated with floating gate FGNI is accomplished through use of the gated diode structure of view (i) of FIG. 2 by changing the voltage value of signal MG, i.e. $V_{MG}$, applied to gate 30 in view (i). Varying positive voltage $V_{MG}$ varies the surface potential at surface 46 under multiplier gate 30. A sufficient change in this voltage can change the doped silicon semiconductor material of substrate 44 at surface 46 under gate 30 from the (a) depletion conditions, i.e. the absence of majority carriers, to the (b) inversion condition, i.e. the accumulation of minority carriers to the point of changing the conductivity type of the semiconductor material near surface 46 from p-conductivity to n-conductivity. If the voltage on multiplier gate 30 is such that semiconductor material therebelow is well into the depletion condition, the capacitance seen at diffusion 37, which is electrically connected to floating gate FGNI, is essentially nothing more than that associated with the depletion condition of the pn semiconductor junction separating diffusion 37 from the remaining portions of substrate 44. This is the minimum capacitance condition at diffusion 37 and in this condition the junction has about twice the capacitance value of the capacitance occurring at that portion of floating gate FGNI adjacent to separating gate FGI-S.

Figure 3A:
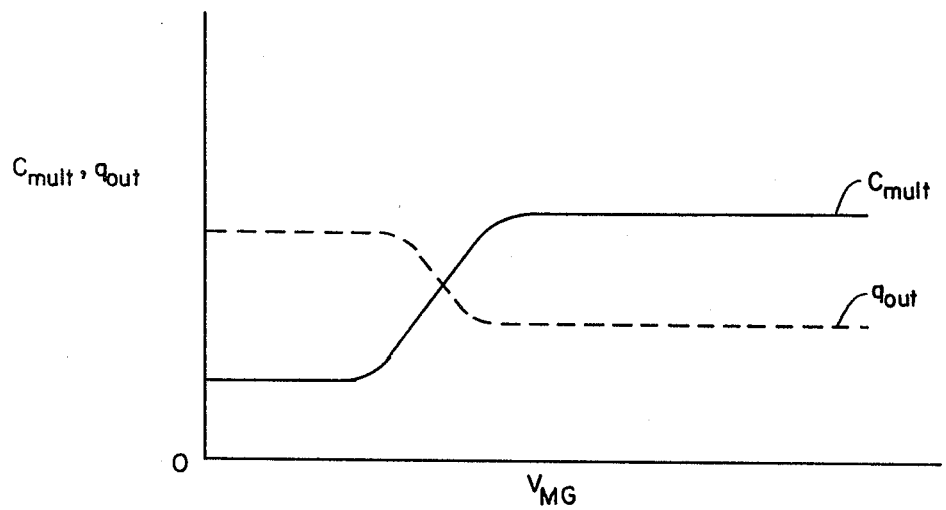
FIG. 3 is a graph of the multiplication capability of the monolithic integrated circuit chip shown in FIGS. 1 and 2.

As voltage $V_{MG}$ applied to gate 30 is increased thereby driving the semiconductor material near surface 46 toward inversion, the effective extent of diffusion 37 begins to spread under multiplier gate 30 so that at strong inversion the capacitance at diffusion 37 is essentially the oxide capacitance of the multiplier gate. This capacitance has about five times the value as that capacitance associated with that portion of floating gate FGNI adjacent to separating gate FGI-S. This change in effective capacitance value at diffusion 37 with changes in value of voltage $V_{MG}$ in signal MG as applied to gate 30 is shown in FIG. 3A where this effective capacitance $C_{mult}$ is represented by a solid line. Thus, a range exists for voltage $V_{MG}$ within which one can control the effective capacitance $C_{mult}$ over a range of capacitance values. $C_{mult}$, because of conductor 38, is one of the capacitances associated with floating gate FGNI in addition to the structural capacitances associated with gate FGNI occurring between it and the chip structural features therebelow.

Figure 3B:
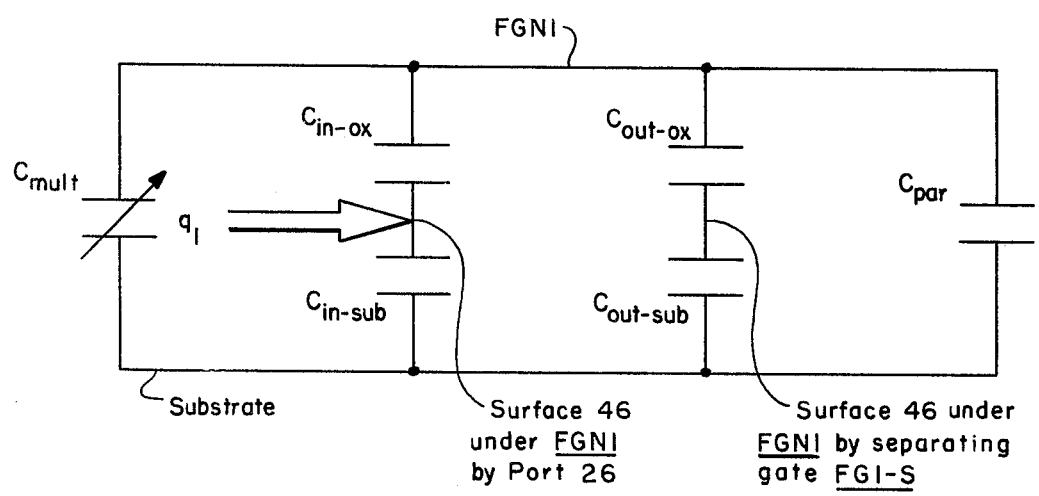

A circuit schematic diagram is shown in FIG. 3B where all the capacitances associated with floating gate FGNI are presented and are indicated as "lumped" capacitances in an equivalent circuit. The first capacitances on the left is just the variable multiplier gate control capacitances $C_{mult}$ described in the immediately preceding paragraphs. The first set of series capacitors to the immediate right of capacitance $C_{mult}$ represent input capacitances associated with the portion of floating gate FGNI that is adjacent to port 26. The upper capacitance, $C_{in-ox}$, in this series string represents the oxide capacitance between the portion of floating gate FGNI near port 26 and surface 46 of the doped silicon semiconductor material of substrate 44. The lower capacitance in the string is the substrate capacitance, $C_{in-sub}$, and represents the depletion capacitance between surface 46 of semiconductor material 44 below gate FGNI new port 26 and the remaining portions of this material. Note that the introduction of input charge packet $q_1$ beneath floating gate FGNI in FIG. 2 corresponds to placing this charge between these two capacitances, $C_{in-ox}$ and $C_{in-sub}$, in FIG. 3B.

The next series string of capacitances to the right of the input capacitances represent the output capacitances associated with the portion of floating gate FGNI that is adjacent to separating gate FGI-S. The upper one in this string of capacitances, $C_{out-ox}$, represents the oxide capacitance between the portion of floating gate FGNI near gate FGI-S and surface 46 of semiconductor material substrate 44 at this location. The lower capacitance, $C_{out-sub}$, in this string represents the substrate capacitance between surface 46 of substrate 44 below gate FGNI near gate FGI-S and remaining parts of this substrate. Note that the surface potential at surface 46 beneath this portion of floating gate FGNI in FIG. 2 corresponds in FIG. 3B to the voltage occurring between these two output capacitances.

Finally, the capacitance on the far right in the circuit schematic in FIG. 3B is the parasitic capacitance, $C_{par}$ representing all the other capacitances that are unavoidably associated with floating gate FGNI. An obvious source of such capacitance can be seen in FIG. 1 as that capacitance associated with the connecting portion of gate FGNI between the portion of floating gate FGNI adjacent to port 26 and the portion thereof adjacent to separating gate FGI-S.

During the operation of the floating gate regenerator depicted in FIGS. 1 and 2, the input capacitances $C_{in-ox}$ and $C_{in-sub}$, the output capacitance $C_{out-ox}$ and $C_{out-sub}$, and the parasitic capacitance $C_{par}$ can be considered essentially constant. Thus, the varying results obtained are due almost solely to the changing of the multiplier capacitance $C_{mult}$.

In operation, in resetting floating gate FGNI by application of clock signal RSNI thereto through the application of clock signal FGR to the gate of transistor 35, gate FGNI is charged to the particular voltage of signal RSNI through the charging of the effective capacitances associated with floating gate FGNI shown in FIG. 3B. The transfer of an input charge packet $q_1$ from storage site 1 at gate 41 to introduce it under the portion of floating gate FGNI where it is adjacent to port 26 has the effect of changing the voltage occurring on floating gate FGNI.

The effect of this voltage change is indicated in the potential energy diagram for floating gate FGNI in view (ii) from the initial condition occurring thereunder at time $t_{i(ii)}$ to the condition occurring at time $t_2$. The voltage change on gate FGNI in FIG. 3B referred to the substrate will equal $\Delta V_{FGNI}=q_1/C_{FGNI-TOT}$. Here $q_1$ is the input charge packet charge quantity as earlier indicated, $V_{FGNI}$ is the voltage on floating gate FGNI, and $C_{FGNI-TOT}$ is the total capacitance occurring between floating gate FGNI and other structural portions of chip 14.

Analysis of the circuit of FIG. 3B shows that the concomitant change in charge induced at the junction of the two output capacitances is equal to $\Delta V_{FGNI} C_{FGNI-OUTPUT}$. Here, $C_{FGNI-OUTPUT}$ represents the effective capacitance occurring at the junction of the two output capacitances in FIG. 3B. If input charge packet $q_2$ shown in FIG. 2 is zero, as will usually be the case when there is a desire to multiply an input charge packet, here $q_1$, by a constant value, this induced charge under the portion of floating gate FGNI adjacent to separating gate FGI-S will just be equal to the output charge $q_{out}$ obtained in completing the operational sequence shown in FIG. 2, or $q_{out}=V_{FGNI}C_{FGNI-OUTPUT}$. Eliminating $V_{FGNI}$ in the last two equations results in $q_{out}=q_1 C_{FGNI-OUTPUT}/C_{FGNI-TOT}$, i.e. the output charge packet is a fraction of the input charge packet where the fraction is set by a ratio of capacitances.

As is well known from circuit theory, capacitance $C_{FGNI-OUTPUT}$ will not be very strongly affected by changes in multiplier capacitance $C_{mult}$. On the other hand, capacitance $G_{FGNI-TOT}$ will be a strong function of $C_{mult}$. Thus, as the last equation indicates, the output charge packet $q_{out}$ will be a function of the input charge packet $q_1$ weighted by a ration of capacitances only one of which is a substantial function of multiplier capacitance $C_{mult}$ which in turn is determined by $V_{MG}$. Note therefore, the last equation above is effectively in the same form as that of the general output equation (with $q_2=0$) first set out above for the floating gate regenerator of cell 15 characterizing the result obtained from the basic operational sequence described in connection with the diagrams of FIG. 2. That is, $q_{out}$ is a function of $V_{MG}$. Thus, the dashed line curve in FIG. 3A for the size of the output charge packet $q_{out}$ indicates the value of $q_{out}$ is a function of $V_{MG}$.

The value of the multiplier in the last equation above will be in the range from 0.2 to 0.5 as capacitance $C_{FGNI-TOT}$ varies from being approximately two times that of capacitance $C_{FGNI-OUTPUT}$ to being five times that capacitance as indicated above. If the desired multiplying constant has a value which lies outside of the range of 0.2 to 0.5, the multiplication process can be repeated on the resulting output charge packet from the first operation, $q_{out}$, or another input charge packet can be operated upon by the multiplication process to provide another fractional output charge packet to be added to the first. Thus, multiplication by constants smaller than 0.2 or by constants greater than 0.5 can be effectively accomplished.

The embodiments of the invention in which an exclusive property or right is claimed are defined as follows:

1. A monolithic integrated circuit for providing a distinct charge aggregation which contains a quantity of charge which is a selected fraction of a quantity of charge contained in another distinct charge aggregation, said circuit comprising:

a semiconductor material body of a first conductivity type except in selected regions thereof including first, second, third, fourth and fifth selected regions which are of a second conductivity type opposite that of said first conductivity type, said semiconductor material body having a first major surface;

a charge-coupled device floating gate regenerator having a conductor serving as an inverting floating gate separated from said major surface by first and second insulating layers with said inverting floating gate being across said first and second insulating layers from first and second portions of said semiconductor material body, respectively, where said first and second portions of said semiconductor material body are separated from one another by means sufficient to prevent a distinct charge aggregation in one of said first and second portions from being transferred into that one remaining, and wherein said charge-coupled device floating gate regenerator further has a conductor serving as a non-inverting floating gate separated from said first major surface by third and fourth insulating layers with said non-inverting floating gate being across said third and fourth insulating layers from third and fourth portions of said semiconductor material body, respectively, where said third and fourth portions of said semiconductor material body are separated from one another by means sufficient to prevent a distinct charge aggregation in one of said third and fourth portions from being transferred into that one remaining, and where said second and fourth portions of said semiconductor material body are separated from one another by means sufficient to prevent a distinct charge aggregation in one of said second and fourth portions from being transferred into that one remaining but where said first and third portions of said semiconductor material body are capable of passing charge from one to another through said semiconductor material body; and a multiplier means including a capacitance selection gate separated from said first major surface by a fifth insulating layer and across from a portion of said semiconductor material body which is immediately adjacent to said first selected region, said non-inverting floating gate being conductively connected to said first selected region, whereby capacitance associated with said first selected region supplements that associated with said non-inverting floating gate such that any charge occurring in said fourth portion of said semiconductor material body affects charge quantities occurring in said third portion of said semiconductor material body to an extent dependent on said capacitance associated with said first selected region as such capacitance is controlled by said capacitance selection gate.

2. The apparatus of claim 1 wherein said first portion of said semiconductor material body across said first insulating layer from said inverting floating gate is free of any of said selected regions at said first major surface thereof and wherein said second portion of said semiconductor material body across said second insulating layer from said inverting floating gate contains said second selected region where it intersects said first major surface, and wherein said third portion of said semiconductor material body across said third insulating layer from said non-inverting floating gate is free of any of said selected regions at said first major surface thereof and wherein said fourth portion of said semiconductor material body across said fourth insulating layer from said non-inverting floating gate contains said third selected region where it intersects said first major surface.

3. The apparatus of claim 2 wherein said third portion of said semiconductor material body, across said third insulating layer from said non-inverting floating gate, is immediately adjacent to said forth selected region where said fourth selected region intersects said first major surface.

4. The apparatus of claim 2 wherein that portion of said inverting floating gate across said first insulating layer from said first portion of said semiconductor material body and that portion of said non-inverting floating gate across said third insulating layer from said third portion of said semiconductor material body are each immediately adjacent to a separating gate, said separating gate being separated from said first major surface by a common insulating layer comprising both said first and third insulating layers.

5. The apparatus of claim 1 wherein said capacitance associated with said first selected region is at least half of that associated with said non-inverting floating gate.

6. The apparatus of claim 2 wherein said first portion of said semiconductor material body, across said first insulating layer from said inverting floating gate, is immediately adjacent to said fourth selected region where said fourth selected region intersects said first major surface.

7. The apparatus of claim 6 wherein said third portion of said semiconductor material body, across said third insulating layer from said non-inverting floating gate, is immediately adjacent to said fifth selected region where said fifth selected region intersects said first major surface.

8. The apparatus of claim 7 wherein said first and third insulating layers are a common insulating layer.

9. The apparatus of claim 1 wherein that portion of said inverting floating gate across said first insulating layer from said first portion of said semiconductor material body is immediately adjacent to a first transfer gate, said first transfer gate being separated by said first insulating layer from said first major surface, and wherein that portion of said inverting floating gate across said second insulating layer from said second portion of said semiconductor material body is immediately adjacent to a second transfer gate, said second transfer gate being separated by said second insulating layer from said first major surface, and wherein that portion of said non-inverting floating gate across said fourth insulating layer from said fourth portion of said semiconductor material body is immediately adjacent to a third transfer gate, said third transfer gate being separated from said first major surface by said fourth insulating layer.

10. The apparatus of claim 9 wherein said first portion of said semiconductor material body across said first insulating layer from said inverting floating gate is free of any of said selected regions at said first major surface thereof and wherein said second portion of said semiconductor material body across said second insulating layer from said inverting floating gate contains said second selected region where it intersects said first major surface, and wherein said third portion of said semiconductor material body across said third insulating layer from said non-inverting floating gate is free of any of said selected regions at said first major surface thereof and wherein said fourth portion of said semiconductor material body across said fourth insulating layer from said non-inverting floating gate contains said third selected region where it intersects said first major surface.

11. The apparatus of claim 10 wherein said third portion of said semiconductor material body, across said third insulating layer from said non-inverting floating gate, is immediately adjacent to said fourth selected region where said fourth selected region intersects said first major surface.

12. The apparatus of claim 10 wherein that portion of said inverting floating gate across said first insulating layer from said first portion of said semiconductor material body and that portion of said non-inverting floating gate across said third insulating layer from said third portion of said semiconductor material body are each immediately adjacent to a separating gate, said separating gate being separated from said first major surface by a common insulating layer comprising both said first and third insulating layers.

13. The apparatus of claim 10 wherein said first portion of said semiconductor material body, across said first insulating layer from said inverting floating gate, is immediately adjacent to said fourth selected region where said fourth selected region intersects said first major surface across said first insulating layer from said first transfer gate.

14. The apparatus of claim 13 wherein said third portion of said semiconductor material body, across said third insulating layer from said non-inverting floating gate, is immediately adjacent to said fifth selected region where said fifth selected region intersects said first major surface.

15. The apparatus of claim 14 wherein said first and third insulating layers are a common insulating layer.

* * * * *